United States Patent [19]

Sandock

[11] Patent Number: 5,538,754
[45] Date of Patent: * Jul. 23, 1996

[54] PROCESS FOR APPLYING FLUID ON DISCRETE SUBSTRATES

[75] Inventor: Leonard R. Sandock, Westboro, Mass.

[73] Assignee: Shipley Company Inc., Marlborough, Mass.

[*] Notice: The portion of the term of this patent subsequent to Mar. 26, 2011, has been disclaimed.

[21] Appl. No.: 139,640

[22] Filed: Oct. 8, 1993

Related U.S. Application Data

[63] Continuation of Ser. No. 675,321, Mar. 26, 1991, abandoned.

[51] Int. Cl.$^6$ .................................................. B05D 5/12
[52] U.S. Cl. ...................... 427/96; 427/209; 427/210; 427/424; 118/410; 118/411
[58] Field of Search ............................. 427/209, 210, 427/96, 424; 118/410, 411

[56] References Cited

U.S. PATENT DOCUMENTS

| | | | |
|---|---|---|---|
| 1,369,186 | 2/1921 | Perry | 427/210 |
| 3,299,854 | 1/1967 | VanLobensels | 118/411 |
| 3,424,836 | 1/1969 | McKelvey et al. | 118/411 |
| 3,526,535 | 9/1970 | Plumat | 117/120 |
| 3,595,204 | 7/1971 | McIntyre | 118/8 |
| 3,698,355 | 10/1972 | Heijnis et al. | 118/411 |
| 3,928,679 | 12/1975 | Jackson et al. | 427/402 |
| 4,025,671 | 5/1977 | Creamer | 427/210 |
| 4,050,410 | 9/1977 | Stroszynski | 118/410 |
| 4,143,190 | 3/1979 | Choinski | 427/420 |
| 4,154,879 | 5/1979 | Choinski | 427/402 |
| 4,230,793 | 10/1980 | Losert et al. | 430/315 |
| 4,343,013 | 8/1982 | Bader et al. | 346/75 |
| 4,362,122 | 12/1982 | Choinski | 118/600 |
| 4,416,214 | 11/1983 | Tanaka et al. | 118/411 |
| 4,425,869 | 1/1984 | Hull | 118/316 |

(List continued on next page.)

FOREIGN PATENT DOCUMENTS

| | | |
|---|---|---|
| A0082585 | 6/1983 | European Pat. Off. |
| A2323572 | 11/1974 | Germany |
| A472739 | 6/1969 | Switzerland |
| A2175278 | 11/1986 | United Kingdom |
| WOA8400344 | 2/1984 | WIPO |

OTHER PUBLICATIONS

E. Choinski, Circuit Manufacturing, pp. 27–31 (May 1988).
Sales Literature—Inca-2000 by Epicor Technology, Inc. (no date).
Abstract of Japan patent JB61049422, Jul. 22, 1986.
Abstract of AN 80–L0547C and SU–724 927 by Derwent Publications Ltd. (no date).
Abstract of Japan Patent No. JB61049422, Jul. 22, 1986.
Abstract of AN 80–L0547C and SU–724 927 by Derwent Publications. (no date).
E. Choinski, Circuit Manufacturing, pp. 27–31 (May 1988).
Sales Literature—Inca-2000 by Epicor Technology, Inc. (no date).
Halliday and Resnick, "Physics Part I", John Wiley & Sons, 1966, pp. 112–114. (no month date).

*Primary Examiner*—Shrive Beck
*Assistant Examiner*—Katherine A. Bareford
*Attorney, Agent, or Firm*—Robert L. Goldberg

[57] ABSTRACT

Processes for uniformly coating substrates, including applying fluid substantially simultaneously onto at least two sides of a substrate. In one aspect, the invention provides positioning a substrate above one or more fluid applicators, and flowing fluid through the one or more fluid applicators upwardly onto the substrate, the fluid applied with a controlled volume per unit surface area of the substrate. A substrate surface also may be aligned along a substantially vertical plane with fluid being applied laterally. In another aspect, at least one fluid applicator faces a first side of a substrate and at least one applicator faces a second side of the substrate, and fluid flows through the fluid applicators onto the first and second substrate sides, the fluid applied with a controlled volume per unit surface area of the substrate.

42 Claims, 2 Drawing Sheets

U.S. PATENT DOCUMENTS

| | | | |
|---|---|---|---|
| 4,466,378 | 8/1984 | Rogers et al. | 118/411 |
| 4,476,165 | 10/1984 | McIntyre | 427/258 |
| 4,489,671 | 12/1984 | Choinski | 118/412 |
| 4,493,857 | 1/1985 | Knigge et al. | 427/96 |
| 4,539,069 | 9/1985 | Fishman et al. | 118/316 |
| 4,544,623 | 10/1985 | Audykowski et al. | 430/280 |
| 4,565,217 | 1/1986 | McIntyre | 137/625.5 |
| 4,585,699 | 4/1986 | Berteaud et al. | 427/210 |
| 4,597,719 | 7/1986 | Tano | 417/317 |
| 4,675,208 | 6/1987 | Kageyama et al. | 118/411 |
| 4,687,137 | 8/1987 | Boger et al. | 230/124 |
| 4,696,885 | 9/1987 | Vijan | 430/311 |
| 4,700,474 | 10/1987 | Choinski | 29/846 |
| 4,798,163 | 1/1989 | Claasen | 118/410 |
| 4,871,584 | 10/1989 | Weber | 427/96 |
| 4,871,593 | 10/1989 | McIntyre | 427/428 |
| 4,891,249 | 1/1990 | McIntyre | 427/421 |
| 4,891,294 | 1/1990 | Noguchi | 430/110 |
| 4,938,994 | 7/1990 | Choinski | 427/96 |
| 4,943,508 | 7/1990 | Yu | 430/129 |
| 5,063,951 | 11/1991 | Bard et al. | 118/411 |

PROCESS FOR APPLYING FLUID ON DISCRETE SUBSTRATES

This is a continuation of applications Ser. No 07/675,321 filed on Mar. 26, 1991, now abandoned.

BACKGROUND OF THE INVENTION

1. Field of the Invention

The present invention relates to improved coating processes and, more particularly, processes for uniformly coating substrates and applying fluid substantially simultaneously onto at least two sides of a substrate. The invention is useful for a wide variety of applications including the manufacture of electronic printed circuit boards, liquid crystal displays and electronic integrated circuits.

2. Background Art

Application of a fluid coating onto a substrate is a necessary process in the manufacture of a wide variety of items. For example, a photoresist composition is applied to a substrate to fabricate printed circuit boards, liquid crystal displays, integrated circuits and other products. A typical liquid-type photoresist composition comprises a photosensitive compound or a photoinitiator dissolved or suspended in an organic solvent composition. After application to a substrate and evaporation of any solvent carrier, the photoresist is selectively exposed through use of a photomask and actinic radiation. The photomask provides areas that are selectively opaque and transparent to the radiation, and thereby defines and transfers a pattern to the photoresist coating layer. The patterned resist is then developed, for example by application of a developer solution. After development of the resist coating, the patterned substrate surface may be selectively processed, such as chemically milled, plated or coated. See, generally, Coombs, *Printed Circuits Handbook*, ch. 11 (McGraw Hill, 3d ed. 1988), incorporated herein by reference. Chemical milling is performed by application of a suitable etchant solution. The etchant solution degrades only those portions of the substrate surface bared of photoresist. Similarly, the substrate can be treated with a suitable plating solution to deposit metal only on those surface areas bared of photoresist.

Other processes require application of a solder resist (soldermask) composition. In the manufacture of a printed circuit board, a solder resist functions to restrict solder deposit or flow to only those areas of a printed circuit board that are not covered by the resist. Providing a uniform coating layer can be challenging as the resist is typically applied after the board surface has been built up in a non-uniform fashion, for example, after fabrication of board circuitry. Applying a uniform coating layer across such an irregular surface is generally a difficult process.

Many coating processes, for instance spray coating and curtain coating, often apply an excess of fluid to a substrate surface. See, for example, U.S. Pat. No. 4,544,623, incorporated herein by reference. Application of excess fluid results in waste as well as requiring clean-up or recovery steps. Additionally, if coating is to be restricted to only a portion of the substrate surface, some type of masking procedure is necessary.

Moreover, many coating methods expose fluid to an open atmosphere for an extended period of time as well as recirculate and/or reuse fluid that has been already exposed to other substrates. For instance, curtain, dip and roller coating processes all may expose fluid to an open atmosphere for extended periods; dip coating immerses multiple substrates in the same coating vessel; and a curtain coating process often recirculates and reuses excess applied fluid.

Such open exposure of fluid and fluid recirculation and reuse gives rise to notable problems. Volatile solvents evaporate from fluid exposed to an open atmosphere. Consequently, either the viscosity of the fluid will vary over time, thus compromising uniformity of the applied coatings, or regular and precise solvent additions must be made throughout the coating process. This latter approach is generally too burdensome for commercial applications, particularly in larger scale operations. Extensive solvent evaporation also poses safety and environmental concerns and requires a suitable venting system. Further, both exposure of fluid to an open atmosphere and fluid reuse results in rapid accumulation of contaminants in the fluid supply. This compromises uniformity of the applied coating and can be entirely unacceptable in many processes. While use of a clean room and scrupulous substrate pre-cleaning can alleviate fluid supply contamination to some degree, such measures are both expensive and burdensome.

Additionally, some coating processes are limited in the range of fluid viscosities that can be satisfactorily applied. For example, to maintain fluid sheet integrity in a curtain coating process, higher viscosity fluids are generally employed. Dip coating provides best results for lower viscosity fluid applications.

These shortcomings of prior coating systems pose significant limitations in the manufacture of many substrates and, more specifically, in the manufacture of printed circuit boards, liquid crystal displays and integrated circuits. Fabrication of these substrates generally requires the application of a highly uniform coating. This demand for coating layer uniformity increases directly with substrate performance requirements. Contamination of fluid supply, viscosity variations arising from solvent evaporation, and other problems of prior coating systems that compromise the integrity and uniformity of the coating layer impose real limits on substrate quality and performance. For example, increased circuit densification is continuously sought; this in turn requires image transfer with maximum resolution. Any irregularities in a photosensitive coating layer generally only serve to reduce resolution. Similarly, higher performance applications require plating processes where plating is strictly limited to specific substrate areas. Decreased resolution of an image patterned on a photosensitive coating can result in migration of a plating solution to substrate areas not intended for plating. Further, photoresists, soldermasks, etchant solutions and other fluids used in the manufacture of printed circuit boards, liquid crystal displays and integrated circuits can be quite expensive. Hence, application of excess fluid or other fluid waste is undesirable.

Another coating method is generally known as "slot coating", in reference to the horizontal, elongate fluid applicator orifice that is typically employed. See, for example, U.S. Pat. Nos. 4,696,885 and 4,938,994, both incorporated herein by reference. It is possible by a slot coating process to apply a generally fixed volume of fluid onto a substrate surface, thus providing advantages of fluid conservation as well as avoidance of excessive fluid dispersion throughout the application area. Further, it is possible by a slot coating process to maintain the fluid in a closed system until deposit of the fluid on a substrate. This overcomes problems of fluid contamination and viscosity variations inherent in "open" type coating systems.

For slot coating on discrete substrates, it is may be preferred to apply a separate fluid volume to each substrate;

that is, a separate start and stop of fluid flow for each substrate. This is referred to as an intermittent fluid application. While slot coating in general enables control of the width of a coating layer by variation of the length of the slot orifice, intermittent slot coating can further enable control of coating layer length by selectively stopping and/or starting fluid flow within the substrate perimeter. Thus, a perimeter area of the substrate can be left uncoated, enabling ease in handling during subsequent manufacturing steps. Terminating fluid flow just up to or within a substrate perimeter can also avoid fluid accumulation along substrate edges. Such accumulation results in an uneven coating layer. Further, there can be multiple starts and stops of fluid flow within the substrate perimeter, providing selectively coated substrate areas without use of a masking type procedure. Still further, intermittent coating enables control of coating throughput so to match drying or other processing capacity.

To apply a uniform fluid layer by intermittent coating, a precise start and stop of flow fluid is required for each treated substrate. Dripping of excess fluid after flow termination, however, is a persistent problem. By depositing an excess of fluid on one portion of the coating layer, dripping compromises the layer's uniformity. Dripping of fluid after flow termination can result in several ways. Surface tension adheres fluid to the outer face of the fluid applicator; after flow termination, this fluid will drip onto the substrate surface. Fluid which has traveled past the flow control apparatus into the fluid applicator will also drip onto the substrate after flow has terminated. Further, precise flow cutoffs are particularly difficult with low viscosity fluids, i.e., fluids having a viscosity of less than about 300 centipoise (cps). Specifically, trailing and dripping of fluid after flow termination is common for low viscosity fluids.

For coating multiple substrate sides, prior slot coating processes generally provide positioning a substrate along a horizontal plane and downwardly applying fluid from an applicator directly above the substrate surface; at a later time flipping the substrate to expose an uncoated surface; and then carrying out another fluid application step for the uncoated side. In addition to the time and expense necessitated by such a multiple step procedure, uniformity between coating layers on different substrates sides is compromised. If drying or other fluid layer processing is performed between fluid applications, the first applied coating layer will be exposed to more processing steps than a subsequently coated substrate side. Even if there are no intervening processing steps, the first coated side will be exposed to an open atmosphere longer than subsequently coated sides. Further, conventional double-sided slot coating processes effectively limit the number and type of suitable coating compositions. Compositions that are altered significantly by longer processing or exposure periods are generally unsuitable due to the consequential discontinuities of the coating layers on each substrate side.

SUMMARY OF THE INVENTION

The present invention comprises improved processes for slot coating-type fluid applications. The invention provides many advantages, including application of a fixed, non-excess fluid volume onto a substrate; precise control of all dimensions—length, width and thickness—of an applied coating layer; numerous means to apply a highly uniform fluid layer on a substrate; and means for increasing coating through-put. Other advantages of the invention will be apparent from the description provided herein.

In one aspect, the invention provides a process for uniformly applying a fluid on a discrete substrate comprising the steps of providing one or more fluid applicators; positioning the substrate above the one or more fluid applicators; and flowing fluid through the one or more fluid applicators upwardly onto the substrate, the fluid applied with a controlled volume per unit surface area of the substrate. Also, a substrate surface may be aligned along a substantially vertical plane with fluid being laterally applied. By such positioning of the substrate and fluid applicator(s), precise termination of fluid flow is achieved. In particular, "dripping" of fluid onto the substrate after flow termination is virtually or entirely eliminated. Consequently, highly uniform fluid layers can be applied on a substrate.

In another aspect, the invention provides a process for applying a fluid on at least two sides of a discrete substrate, the process comprising the steps of providing at least two fluid applicators; positioning the substrate between the fluid applicators wherein at least one applicator faces a first side of the substrate and at least one applicator faces a second side of the substrate; and flowing fluid through the fluid applicators onto the first and second sides of the substrate, the fluid applied with a controlled volume per unit surface area of the substrate. Preferably, fluid flows substantially simultaneously through each of the fluid applicators. The first and second sides of the substrate may be opposing sides of the substrate aligned along any plane, including along a substantially horizontal plane or any non-horizontal plane such as a vertical plane. For substrates that require multiple-sided coating, this process provides great savings of processing time and costs. A more uniform coating layer is also provided as subsequent processing steps, such as heating to remove volatile liquid carriers, will be applied in the same manner to each side of the substrate. Still further, this multiple side coating process enables application of fluids that may be too sensitive for the uneven processing or exposure periods of conventional multiple side slot coating.

The fluid applicator(s) of the present invention can be spaced from the substrate. The fluid applicator has an opening therethrough for dispensing fluid onto a substrate, preferably an, elongate shaped, i.e., slot-shaped, opening. Extending from the applicator opening is an applicator outer face which, preferably, comprises a non-wetting material. The non-wetting material reduces or eliminates accumulation of fluid on the applicator face that might otherwise drip onto the substrate after flow termination. The fluid applicator also has an inner chamber in communication with a fluid reservoir. For application of low viscosity fluids, i.e., fluids having viscosities less than about 300 cps, at least portions of the walls of the applicator chamber are preferably textured. Such texturing increases the apparent viscosity of fluid flowing through the chamber, thereby substantially reducing trailing and dripping of fluid after flow termination. The fluid applicator also may be in communication with a vacuum to prevent dripping of the fluid onto the substrate after fluid flow termination. At about the same time fluid flow is terminated, the vacuum is applied to withdraw traces of fluid within the applicator.

A wide variety of substrates may be coated with a fluid in accordance with the present invention. For example, the substrate may have a non-uniform surface and comprise virtually any material including a dielectric material, glass or metallized glass, a semiconductor material or a conductive material. Similarly, virtually any type of fluid may be applied by the processes of the invention including, for example, a flowable material comprising 100 percent solids, photosensitive compositions including photoimageable photoresists and soldermask compositions, chemical etchants and chemical developer and stripper solutions.

The present invention is generally discussed in terms of applying fluid onto a discrete substrate. However, the invention also can be employed for coating what is viewed as a nondiscrete substrate such as a continuous web.

The term "fluid" as used herein means any material capable of being coated onto a substrate and includes a flowable material of 100 percent solids without any type of liquid carrier, a liquid, emulsion or slurry, or any other flowable material.

BRIEF DESCRIPTION OF THE DRAWING

A more complete understanding of the invention may be provided by reference to the accompanying Drawing in which like reference numbers refer to like elements throughout the various figures.

DESCRIPTION OF THE PREFERRED EMBODIMENTS

In one aspect, the invention comprises proximately positioning a substrate above one or more fluid applicators and flowing fluid upward onto the substrate surface. The substrate may be positioned above the fluid applicator at any angle. Thus, the applicator and substrate may be aligned at any angle between a horizontal and vertical plane, or the applicator and substrate may be aligned along a substantially horizontal plane with fluid flowing directly upward in a vertical direction onto the substrate surface. Additionally, a substrate surface may be aligned along a substantially vertical plane with fluid being laterally applied, i.e. fluid flowing in a horizontal direction. By positioning a substrate above an applicator as well as positioning the substrate along a substantially vertical plane, dripping or trailing of fluid onto the substrate after flow termination is substantially eliminated thereby enabling application of a highly uniform fluid layer onto a substrate.

When positioning the substrate along a non-horizontal plane and/or flowing fluid upwardly onto the substrate, the applied wet fluid layer can migrate along the substrate surface over time and consequently result in a non-uniform coating layer. To prevent significant migration of the applied fluid along the substrate surface that could inhibit the utility of the fluid layer, it is necessary to remove any volatiles of the fluid promptly after fluid application and thereby "set" the fluid layer on the substrate surface. Volatile components of the fluid can be removed by heating the substrate with the fluid layer thereon by known means such as an infrared dryer or a convection oven. The time period within which volatile components of a fluid composition must be removed to prevent migration after application will vary with the angle the substrate is positioned from a horizontal plane as well as the characteristics of the applied fluid, for example the fluid's viscosity, cohesiveness and the wet thickness of the fluid layer. Thus, the smaller the angle of incline of the substrate (and thus the smaller gravitational effect on the applied fluid), the greater the fluid's viscosity and cohesiveness and the greater the coating layer thickness, significant migration will occur at a relatively longer time after fluid application. It is generally preferred to commence drying of the fluid layer within about one minute after application of the fluid onto the substrate, and to complete removal of the fluid's volatile components within about five minutes after fluid application. As should be clear however, depending on the above noted factors of substrate position, characteristics of the applied fluid and coating layer thickness, it may be satisfactory to commence drying of the coating layer later than one minute after fluid application, or it may be necessary to commence removal of the volatile components sooner than one minute after fluid application.

Figure 1:
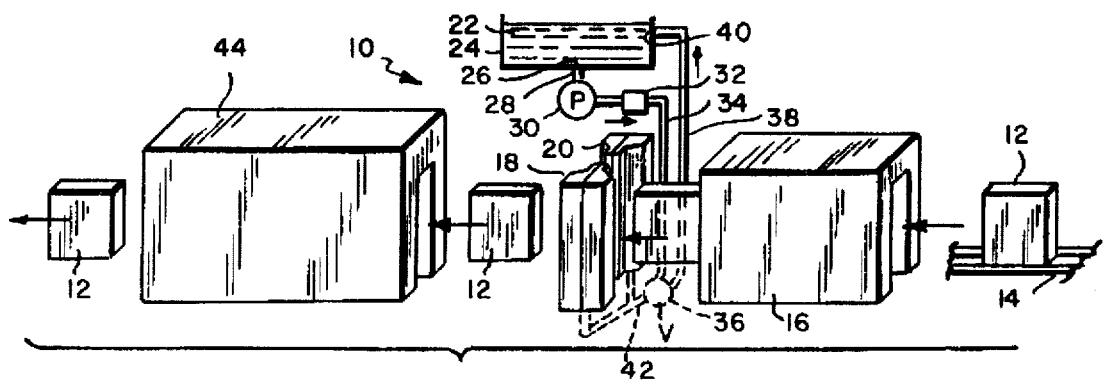
FIG. 1 is a side view of one embodiment of the present invention.

Referring more specifically to the Drawing, FIG. 1 depicts coating system 10 as employed for applying fluid substantially simultaneously to multiple sides of a substrate. While the following discussion is generally in terms of coating multiple substrate sides, the discussion generally is equally pertinent to fluid applications to only a single substrate side. More specifically, for single-sided applications, the only significant change made from system 10 is that one or more fluid applicators are positioned only on one side of the substrate.

Substrate 12 is placed on transport means 14 and transported through system 10. Substrate 12 may be composed of virtually any type of material and be used for virtually any type of application. Suitable transport means 14 may be any of a number of apparatus as is apparent to those skilled in the art. For example, transport means 14 may be an electric rail system wherein the bottom edge of substrate 12 is affixed to one or more rails and the substrate transported thereby throughout the fluid application system. The substrate edge may be affixed to the transport means by a vacuum or by mechanical means. A conveyer belt system is also a suitable transport means, for example the conveyer table identified by the name X–Y and sold by D.C.I. Company of Franklin, Mass.

The substrate may be heated prior to fluid application by heating means 16 to thereby provide a more uniform coating layer, although highly uniform coating layers have been applied without heating the substrate above room temperature. In addition to reducing topography irregularities of the substrate, for instance warp and twist of a printed circuit board, pre-heating provides a more uniform coating by what is believed to be a degassing effect. Further, substrate pre-heating can inhibit any potential fluid migration by enhancing the rate of evaporation of volatile fluid components. The substrate may be heated to a temperature within a broad range, preferably between about 35° C. to 70° C. Heating means 16 may be a variety of devices as is apparent to those skilled in the art, for example hot air blowers positioned on opposing sides of substrate 12.

Figure 2:
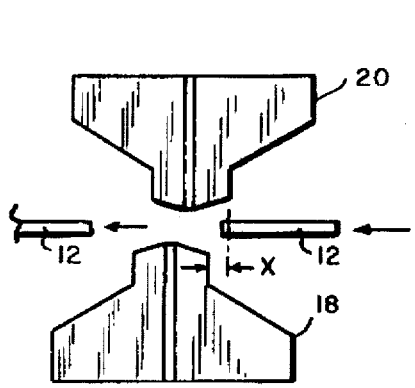
FIG. 2 is a top view showing two fluid applicators employed in accordance with the present invention.

Substrate 12 is then passed through fluid applicators 18 and 20. As the substrate passes through the applicators, the fluid issues under a positive pressure as a connected fluid bead from the fluid applicators and is deposited onto the substrate surface as a uniform layer. For double-sided coating, fluid is preferably applied substantially simultaneously through applicators 18 and 20 onto the proximate substrate 12. As depicted in FIG. 1, substrate 12 is aligned along a substantially vertical plane with fluid to be laterally applied thereon. Applicators 18 and 20 may be offset a distance "x" as shown in FIG. 2, with x generally equal to between about 2 and 5 millimeters. Alternatively, applicators 18 and 20 may not be offset, that is, the applicators aligned for their length along the substantially same plane so that the distance x shown in FIG. 2 is zero. Not offsetting the applicators is preferable when fluid "tenting" is desired. Tenting describes the ability of fluid to cover, bridge or span an unsupported substrate area, for example a through-hole of an electronic printed circuit board. See, generally, Coombs, *Printed Circuits Handbook*, p. 11–24 (3d ed., 1988). Fluid tenting is advantageous in many applications; for example, by spanning a printed circuit board through-hole with a resist coating, the through-hole is protected during subsequent etching or other processing steps. By not offsetting applicators 18 and 20, air is trapped within a through-hole during double-coated coating, providing support for the applied fluid and thereby enhancing the fluid's ability to span the orifice. As is known in the art, fluids of higher viscosities and cohesion will provide better tenting properties.

Fluid 22 is contained in vessel 24. The vessel 24 should be constructed of a material resistant to degradation by the fluid. A stainless steel vessel is suitable. If fluid 22 is susceptible to air oxidation or other degradation, the fluid is preferably stored in vessel 24 under an inert atmosphere, for example an atmosphere of nitrogen or argon. Pump 30 controls the flow rate of the fluid. By action of pump 30, a controlled volume of fluid flows through vessel opening 26 through connecting means 28, pump 30, connecting means 34, valve 36 and connecting means 42 and then through the applicators 18 and 20 onto substrate 12. Also by action of pump 30 fluid can be recirculated through the system back to vessel 24. Pump 30 preferably is a high tolerance metering pump, such as a Zenith brand pump known to those in the art, capable of delivering a unit of fluid to within an accuracy of a tenth of a cubic centimeter. Such a precision metering pump is sold by Acumeter Laboratories of Marlboro, Mass.

Fluid 22 preferably flows through filter 32 which removes undesired contaminants. Filter 32 either may be positioned after pump 30 as depicted in FIG. 1, or between vessel 24 and pump 30. Suitable filters will vary with the particular fluid circulating through the system. Process filters sold by the Millipore Corporation of Bedford, Mass. are suitable filters for many fluids including photoresist compositions.

Valve 36 controls whether fluid will flow through the fluid applicators or will be recirculated back to vessel 24. That is, fluid flow is commenced and terminated by manipulation of valve 36. Valve 36 may be of a variety of designs. A preferred valve is a two-position poppet valve with a single fluid supply input to the valve assembly. When the two-position valve is placed in the "up" position, fluid flow is commenced and fluid flows into connecting means 42, through applicators 18 and 20 and onto substrate 12 as a connected fluid bead. When the two-position valve is placed in the "down" position, fluid flow into the fluid applicators and onto the substrate is effectively terminated, and fluid flows to connecting means 38 and thereby returns to vessel 24 through opening 40. As should be clear, by commencing and terminating fluid flow at appropriate times as the substrate passes proximately by the one or more fluid applicators, a fluid layer up to, within, or beyond the substrate perimeter can be deposited. Use of valve 36 in general provides sharp, uniform starts and stops of fluid being deposited on the substrate. A suitable two-position valve is of stainless steel construction and sold by Acumeter Laboratories of Marlboro, Mass. Also, suitable poppet valves are described in U.S. Pat. Nos. 4,891,249 and 4,565,217, both incorporated herein by reference.

Connecting means 28, 34, 38 and 42 may be constructed from a variety of materials as is apparent to those skilled in the art. For example, the connecting means may be standard stainless steel tubing or polymer tubing, such as chloride polyvinyl chloride tubing, or virtually any other material that is resistant to degradation by the fluid. After application of fluid 22, substrate 12 may be placed in heating means 44 to evaporate volatile solvents to prevent migration of the applied fluid layer or otherwise process the coated substrate. As noted, heating means 44 may be a variety of known apparatus, such as an infrared dryer or a convection oven.

Figure 3:
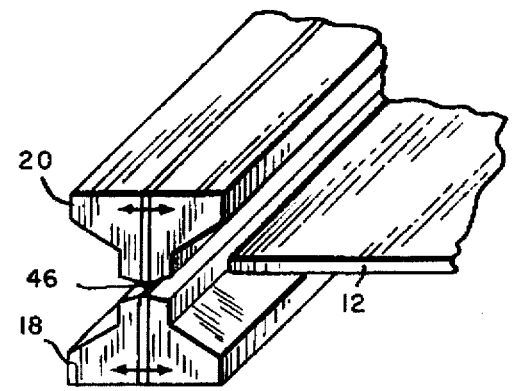
FIG. 3 is an above view showing two fluid applicators employed in accordance with the present invention.

Many variations from this general system are within the scope of the invention. Thus, as generally depicted in FIG. 3, rather than employing transport means 14, substrate 12 may remain stationary with applicators 18 and 20 moving laterally relative to substrate 12. After fluid application, substrate 12 may be removed and another substrate placed between the applicators. While substrate 12 is aligned along a substantially vertical plane in FIG. 1, substrate 12 also may be aligned along any non-vertical plane, including a substantially horizontal plane as depicted in FIG. 3 wherein applicator 18 is shown as positioned for applying fluid upwardly in a substantially vertical direction.

Further, multiple fluid applicators may be positioned on each side of a substrate, with each fluid applicator connected to a separate fluid reservoir. This can enable application of different fluid compositions onto different substrate sides; application of different fluid compositions onto substrates passing consecutively through the coating system; or coating multiple fluid layers per single pass of a substrate through the coating system. Thus, multiple layers can be applied successively on top of previously applied layers without a drying step between each layer application. The layers will stay separate and distinct for a time period that varies with fluid viscosity and cohesiveness as well as the thickness of each coating layer. Hence, fluid migration between the coating layers can be prevented by removing volatile components of the fluid or otherwise "setting" the coating layers promptly after fluid application.

Figure 4:
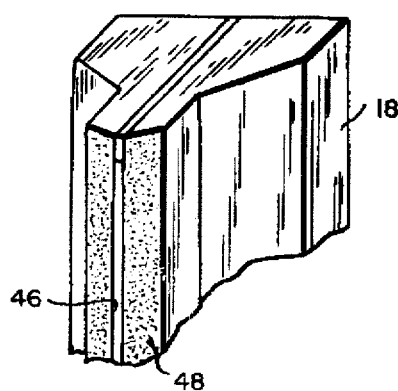
FIG. 4 is a front view of a preferred fluid applicator;.

FIG. 4 depicts a preferred fluid applicator having a slot-like opening 46 extending the length of applicator 18. The width of slot opening 46 is generally between about 2 mils and 20 mils and varies within that range depending on the viscosity of the particular fluid being applied. Higher viscosity fluids require a greater width of the slot opening. Thus, for applying a fluid having a viscosity of about 300 cps, the width of opening 46 is suitably between about 2 to 4 mils; for applying a fluid of viscosity of about 10,000 cps, the width of opening 46 is suitably about 5 mils; and for applying a fluid of viscosity of about 40,000 cps, width of opening 46 is suitably between about 10 to 15 mils.

The length of applicator 18 and opening 46 will also vary with application. It should be appreciated that the width of a coating layer can be precisely controlled by the varying the length of opening 46. For applying a fluid on an electronic printed circuit board, a suitable length of applicator 18 is about 24 inches and a suitable length of opening 46 is about 23.5 inches.

Figure 5:
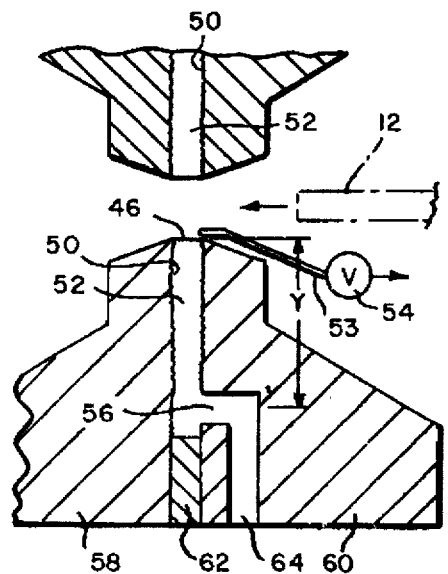
FIG. 5 is a cross sectional view of fluid applicators of the present invention.

Face 48 of applicator 18 extends from the perimeter of opening 46 and preferably tapers away and back from the opening perimeter at a sharp angle as clearly shown in FIGS. 4 and 5. It has been found that regressing applicator face 48 back from the plane of opening 46 provides fluid flow starts and stops of greater precision. In general, face 48 tapers back from opening 46 at a forty-five degree angle, although regressing face 48 at other angles is also suitable. Preferably, the surface of applicator face 48 comprises a non-wetting material. Without the use of a non-wetting material, surface tension tends to cause fluid to collect on the applicator face 48. Consequently, without the use of a non-wetting material on face 48, after fluid flow has been terminated fluid may drip from face 48 onto the substrate resulting in deposit of excess fluid and a non-uniform coating layer. The non-wetting material may be any compound or composition which retards the collection of fluid on applicator face 48. A preferred non-wetting material is the tetrafluoroethylene polymer identified by the trademark of Teflon (E. I. DuPont de Nemours Company), although it is clear that other known non-wetting materials also should provide good results, for example silicone compounds.

For applying fluids of relatively low viscosities, for example fluids of viscosity of less than about 300 cps, the inner chamber walls 50 of applicator 18 are preferably textured. Chamber walls 50 define applicator chamber 52 through which fluid passes enroute to opening 46. It has been found that suitable roughening of walls 50 creates a drag effect increasing the apparent viscosity of fluid flowing through chamber 52. This gain in apparent viscosity reduces the occurrence of fluid dripping and trailing after flow termination. Chamber walls 50 may be suitably textured by a variety of means including affixing a textured material such as sandpaper on the chamber walls as well as suitably abrading the chamber walls, for example sand blasting walls 50.

To avoid dripping or trailing of fluid after flow termination, the fluid applicator preferably is in communication with vacuum 54 as depicted in FIG. 5. At approximately the same time fluid flow is terminated by manipulation of valve 36, a vacuum is applied to the fluid applicator through suitable connective means 53 such as polymer tubing to withdraw traces of fluid within the applicator. Also, the vacuum may be applied at a relatively lower pressure during fluid application to avoid application discontinuities that may be caused by the air boundary layer. For the vacuum system shown in FIG. 5, to withdraw traces of fluid within the fluid applicator after flow termination, a vacuum pressure of about 2.0 to 3.0 inches of water is suitable; and for reducing the effect of the air boundary layer during fluid flow, a vacuum pressure of about 1.0 to 1.5 inches of water is suitable.

As shown in FIG. 5, the vacuum connective means 53 can communicate with chamber 52 by being positioned proximately to opening 46, although it is clear that the vacuum could communicate with the fluid applicator by other means. For example, applicator portion 58 can have an orifice through its width in communication with chamber 52 and further in communication with a vacuum source. Such an orifice can be shielded from fluid flow through chamber 52 by placing a suitable separation wall within the chamber.

The vacuum source (e.g., a mechanical vacuum pump) can produce vibrations which, if communicated to the substrate, will result in coating layer irregularities. Thus, a baffling system is preferably used with vacuum 54 to absorb such vibrations. Suitable baffling means can be a variety of systems, including a depth-type tank where at least portions of the vacuum connective means 53 are immersed in a volume of liquid, the liquid dissipating vibrations being communicated from the vacuum source along the connective means.

The distance "y" as shown in FIG. 5, known in the art as the land length, is the distance from applicator reservoir 56 to applicator opening 46. Fluid flows from connecting means 42 through applicator orifice 64 into the applicator reservoir 56 and into chamber 52. For application of a uniform coating layer on a substrate, the land length must be sufficient to provide laminar flow and a sufficient pressure drop of the fluid. Thus, the land length is preferably greater than one inch and most preferably is between about 1.25 inches and 1.5 inches. With relatively wide coating applications, for example where the length of opening 46 is greater than 50 inches, land lengths of up to 4 inches can be employed.

Figure 6:
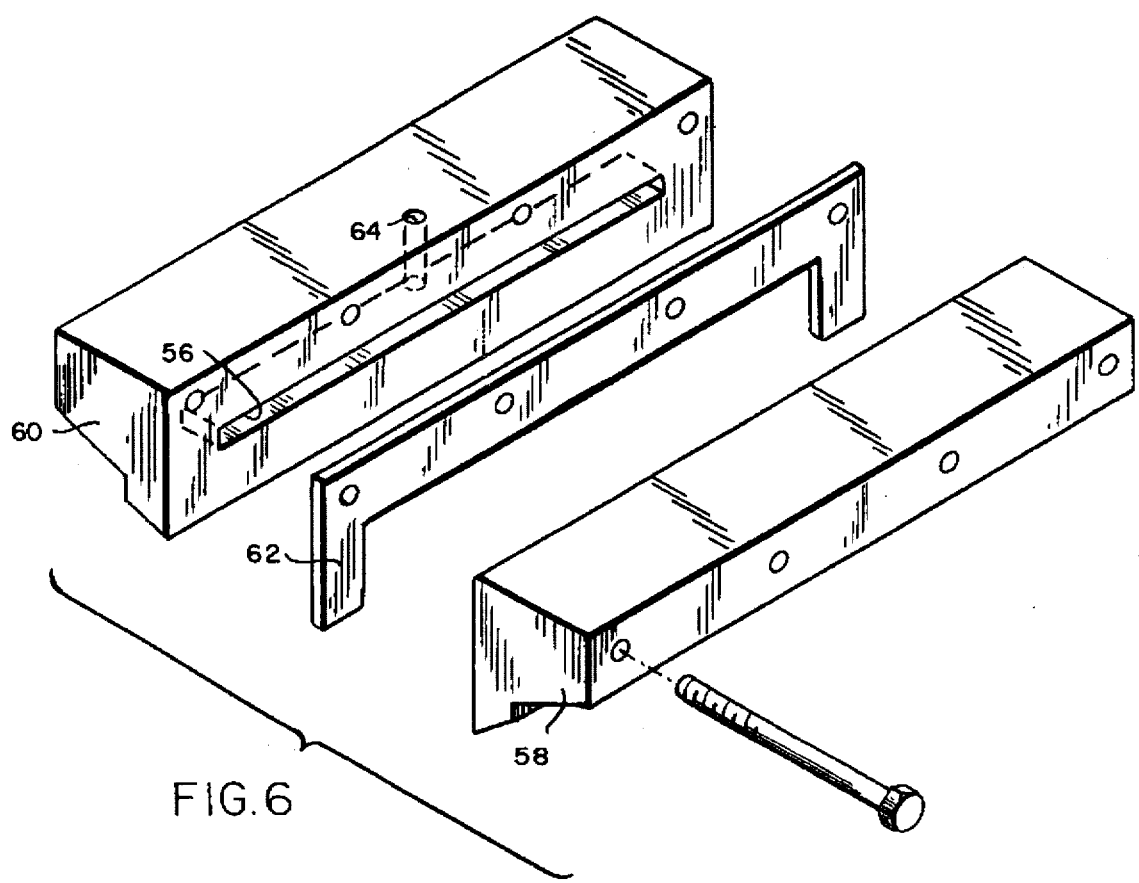
FIG. 6 is an isomeric view of a fluid applicator of the present invention.

A preferred construction of a fluid applicator is shown in FIG. 6. The applicator has first portion 58 and second portion 60 and a shim 62 positioned therebetween. Applicator portions 58 and 60 and shim 62 can be constructed of a variety of materials including hardened steel, stainless steel, aluminum or a suitable polymer. The thickness of shim 62 determines and equals the width of applicator opening 46. Thus, for example, for a width of opening of 5 mils, a shim having a thickness of 5 mils is employed. Multiple shims, with each shim abutted against another, also can be employed to vary the width of opening 46. Applicator reservoir 56 is generally orthogonally extending relative to the direction of fluid flow from orifice 64 to thereby permit expansion of the fluid along the length of the applicator 18. For a fluid applicator of about 24 inches length, the length of applicator reservoir 56 suitably can be about 18 inches with a volume of about 20 cubic centimeters, although the dimensions of reservoir 56 are not believed to be critical provided uniform fluid distribution is realized along the length of the applicator. While a fluid applicator may have greater than one orifice 64 and corresponding reservoir 56, enhanced fluid flow through the applicator is realized through use of a single orifice 64 and reservoir 56. In particular, for low viscosity fluid applications, it has been found that fluid streaking is reduced by employing only one reservoir 56 and a length land of at least 1 inch. Preferably, orifice 64 is positioned concentrically along the length of reservoir 56 as shown in FIG. 6. During use of applicator 18, first portion 58, second portion 60 and shim 62 are positioned together in tight engagement by any suitable means such as bolt means as shown in FIG. 6.

A notable advantage of the coating system 10 is that in a preferred aspect fluid flows without substantial interruption from the general reservoir of fluid through the one or more fluid applicators onto the substrate. As should be clear, vessel 24, pump 30, valve 36 and connecting means 26, 34 and 38 in general together comprise a fluid reservoir system, which preferably is substantially closed from the external environment. To provide direct fluid flow to the fluid applicators, valve 36 preferably is positioned in close proximity of the fluid applicator(s). In a preferred system, a three cubic centimeter volume or less exists between valve 36 and the one or more fluid applicators. By not placing the fluid in an intermediate vessel between the fluid applicators and the general reservoir system, or otherwise restricting the fluid flow to the applicators and onto the substrate, a simpler and more efficient fluid application system is provided. Additionally, by not restricting direct fluid flow from the general reservoir system to the fluid applicators and onto the substrate, possible layering or other potential discontinuities of the fluid are avoided that could result in a non-uniform coating layer. For high performance applications such as imaging and development of a high resolution photoresist pattern (e.g., development of a line width less than about 2 mils), it can be crucial that the applied photoresist be of a consistent composition throughout the coating layer on the substrate. Any irregularities in the applied photoresist layer can serve to limit resolution of the developed image.

Preferably the entire fluid reservoir is continuously circulated prior to fluid application. After flow termination, i.e., placing valve 36 in the down position, virtually any fluid within the fluid applicators or connecting means 42 is either deposited onto the substrate or withdrawn from the system by vacuum 54. By circulating the entire reservoir of fluid, layering and potential other fluid discontinuities can be avoided.

The fluid applicators are typically spaced from the substrate, the spacing distance known as the coating gap and measured from the applicator opening 46 to the substrate surface. The coating gap may vary within a broad range with a gap of between about 5 to 20 mils being generally employed, and may vary within range with factors such as substrate topography. For applying a fluid consisting of 100 percent solids, a smaller coating gap may be preferable, for example a coating gap of about 0.125 mils.

The thickness of the applied fluid layer after drying of an volatiles is equal to the product of the following equation:
(flow rate) (percent solids) (specific gravity) (coating width) (coating speed)

In this equation, flow rate, percent solids and specific gravity all refer to the fluid as applied on the substrate. Coating width is the width of the applied fluid layer and coating speed is the length of coated substrate per unit time. A wide range of coating thicknesses may be provided by the present invention, including coating layers of thicknesses of between about 1 and 150 microns or greater.

As should be clear, by the general means of pump 30 and valve 36, a controlled volume of fluid can be applied per unit surface area of the substrate. Continuous applications also may be made by not terminating fluid flow after coating a single substrate. For continuous applications of discrete substrates, it may be preferable to abut one substrate against another to minimize fluid waste.

Virtually any type of fluid of virtually any viscosity can be applied onto a substrate in accordance with the invention including photoresist and soldermask compositions, chemical developer and stripper solutions for photoresist compositions, chemical etchant solutions, and permanent dielectric coatings such as a permanent soldermask composition. Such fluids are described in Coombs, *Printed Circuits Handbook* (3d ed., 1988). Similarly, virtually any type of substrate may be coated with fluid in accordance with the invention including dielectric substrates such as polymeric and ceramic substrates used in electronics applications; conductive substrates such as a metallic sheet from which a substrate can be chemically etched, or a printed circuit board precursor such as a copper clad laminate; and substrates used as liquid crystal displays such as glass or metallized glass substrate. Also suitable are substrates useful in the printing industry such as aluminum substrates that can be used as relief plates as well as substrates that can be used as name plates (e.g., a name plate affixed to a product to provide identification thereof). Name plates are commonly formed from an anodized aluminum substrate through application and processing of a photoresist composition. The processes of the present invention also provide uniform fluid applications on nonuniform surfaces such as a printed circuit board having through-holes and/or circuit traces thereon.

As noted the present invention is particularly well suited for the manufacture of printed circuit boards. It is often preferable to coat a photoresist or other fluid within a circuit board perimeter leaving an uncoated border area that is convenient for manipulation of the board during subsequent processing steps. Thus, to provide such a coating layer within the circuit board perimeter, fluid flow is commenced and terminated within the board perimeter. Also, to compensate for circuit board warp and twist which can compromise uniformity of a coating layer, a nip roller is preferably used. The nip roller traverses the board surface just ahead (e.g., 0.125 inches) of the fluid applicator and contacts the board with force sufficient to provide a more uniform, i.e., level, substrate surface. For substrates of widths greater than about 24 inches, use of multiple smaller width nip rollers is generally preferred.

The invention is also particularly useful for liquid crystal display (LCD) manufacture. This requires applying a uniform fluid layer (e.g., a photoresist layer) of a dry thickness as small as about 2 to 3 microns on a suitable substrate such as substrate comprising glass or metallized glass. Spin coating has been the traditional fluid application method for LCD manufacture. However, this method has several shortcomings, including application of an excess of fluid as well as fluid accumulation along substrate edges and corners. It has been found the present invention is well suited for LCD applications as it overcomes such problems of the prior art and enables deposit of a highly uniform fluid layer on a glass or other suitable substrate, the fluid layer having a dry thickness of 2 to 3 microns. Specifically, in one application sequence for the fabrication of a liquid crystal display, a photoresist composition of about 30 percent solids and having a viscosity of about 300 cps was applied as a wet film thickness of about 7 microns on a glass substrate to provide a dry film thickness of approximately 3 microns. No significant migration of the wet coating layer was observed, and a highly uniform dry coating layer was provided.

As the present invention enables the application of a highly uniform coating layer, it is also well suited for the manufacture of dry film photoresists. A dry film resist is typically produced by coating a photopolymerizable resist composition onto a suitable support such as a polyolefin film and then covering the resist with a thin polymer film, for example a polyester film. The thin film is peeled away prior to use and the solid resist layer applied to a substrate surface. See, generally, W. S. DeForest, *Photoresist Materials and Processes*, pp. 163–212 (McGraw Hill 1975), incorporated herein by reference.

The foregoing description of the present invention is merely illustrative thereof, and it is understood that variations and modifications can be effected without departing from the spirit or scope of the invention as set forth in the following claims.

What is claimed is:

1. A process for applying a uniform fluid layer to each side of a discrete flat substrate adapted for use in electronic applications or liquid crystal display applications or as a relief plate or name plate, said process comprising the steps of:

(a) providing at least two fluid applicators;
   (b) passing a substrate between the fluid applicators wherein at least one fluid applicator having an elongate-shaped opening faces a first side of said substrate and extends along said first substrate side, at least one fluid applicator having an elongate-shaped opening faces a second side of said substrate and extends along said second substrate side;
   (c) substantially simultaneously flowing a fluid having a volatile component out of each of the fluid applicators through the elongate-shaped openings thereof onto the first and second sides of the substrate to apply a uniform fluid layer on each of said first and second substrate sides, said fluid being applied with a controlled volume per unit surface area of the substrate with the fluid flow commencing and terminating to provide said uniform fluid layers up to, within, or beyond the substrate perimeter, said fluid being circulated within a substantially closed system prior to flowing the same through the fluid applicators; and (d) simultaneously removing volatiles from the fluid coating on each side of said substrate by heating.

2. The process of claim 1 where the first and second sides of the substrate are aligned along a substantially horizontal plane.

3. The process of claim 1 where the first and second sides of the substrate are aligned along a non-horizontal plane.

4. The process of claim 1 where the first and second sides of the substrate are aligned along a substantially vertical plane.

5. The process of claim 1 where the fluid is applied within the perimeter of the substrate.

6. The process of claim 1 where the fluid is applied up to the perimeter of the substrate.

7. The process of claim 1 where the substrate has a non-uniform surface.

8. The process of claim 1 where the substrate comprises a dielectric material.

9. The process of claim 1 where the substrate is a printed circuit board having through-holes; a first fluid applicator faces a first side of the circuit board and a second fluid applicator faces a second side of the circuit board, the first and second circuit board sides being opposing sides of the circuit board; the first and second fluid applicators for their length aligned along the substantially same plane; and fluid flows substantially simultaneously through each of the fluid applicators.

10. The process of claim 1 where at least portions of the substrate surface are metal.

11. The process of claim 1 where the fluid comprises a photosensitive substance.

12. The process of claim 1 where the fluid comprises a material selected from a permanent dielectric coating, photoresist composition, soldermask composition, chemical etchant solutions, chemical developer solutions and chemical stripper solutions.

13. The process of claim 1 where each fluid applicator has an opening therethrough; and each fluid applicator has an outer face extending from the perimeter of the applicator opening, the surface of the applicator outer face comprising a non-wetting material.

14. The process of claim 13 where the non-wetting material is selected from the group consisting of TEFLON and a silicone compound.

15. The process of claim 13 where the applicator outer face regresses back from the applicator opening.

16. The process of claim 1 where at least one of the one or more fluid applicators has walls therein defining a chamber, the chamber in communication with a source of fluid, and at least portions of the chamber walls are textured whereby the apparent viscosity of fluid flowing through the chamber is increased.

17. The process of claim 1 further comprising the step of applying a vacuum to within one or more fluid applicators at approximately the same time fluid flow is terminated.

18. The process of claim 1 further comprising the step of removing volatile components of the fluid on the substrate surface within a time sufficient to prevent significant migration of the fluid along the substrate surface.

19. The process of claim 1 where the substrate is a printed circuit board substrate.

20. The process of claim 1 where the substrate is an integrated circuit substrate.

21. The process of claim 1 where the fluid applied to the substrate as a connected fluid bead.

22. A process for applying a uniform fluid layer to each side of a discrete flat substrate adapted for use in electronic applications or liquid crystal display applications or as a relief plate or name plate, said process comprising the steps of:

(a) providing at least two fluid applicators;

(b) passing a substrate between the fluid applicators wherein at least one fluid applicator having an elongate-shaped opening faces a first side of said substrate and extends along said first substrate side, at least one fluid applicator having an elongate-shaped opening faces a second side of said substrate and extends along said second substrate side;

(c) substantially simultaneously flowing a fluid as a connected fluid bead having a volatile component out of each of the fluid applicators through the elongate-shaped openings thereof onto the first and second sides of the substrate to apply a uniform fluid layer on each of said first and second substrate sides, said fluid bead being applied with a controlled volume per unit surface area of the substrate with the fluid flow commencing and terminating to provide said uniform fluid layers up to, within, or beyond the substrate perimeter; and (d) simultaneously removing volatiles from the fluid coating on each side of said substrate by heating.

23. The process of claim 22 where the fluid is circulated within a substantially closed system prior to flowing through the fluid applicators.

24. The process of claim 22 where the first and second sides of the substrate are aligned along a substantially horizontal plane.

25. The process of claim 22 where the first and second sides of the substrate are aligned along a non-horizontal plane.

26. The process of claim 22 where the first and second sides of the substrate are aligned along a substantially vertical plane.

27. The process of claim 22 where the fluid is applied within the perimeter of the substrate.

28. The process of claim 22 where the fluid is applied up to the perimeter of the substrate.

29. The process of claim 22 where the substrate has a non-uniform surface.

30. The process of claim 22 where the substrate comprises a dielectric material.

31. The process of claim 22 where the substrate is a printed circuit board having through-holes; a first fluid applicator faces a first side of the circuit board and a second fluid applicator faces a second side of the circuit board, the first and second circuit board sides being opposing sides of the circuit board; the first and second fluid applicators for their length aligned along the substantially same plane; and fluid flows substantially simultaneously through each of the fluid applicators.

32. The process of claim 22 where at least portions of the substrate surface are metal.

33. The process of claim 22 where the fluid comprises a photosensitive substance.

34. The process of claim 22 where the fluid comprises a material selected from a permanent dielectric coating, photoresist composition, soldermask composition, chemical etchant solutions, chemical developer solutions and chemical stripper solutions.

35. The process of claim 22 where each fluid applicator has an opening therethrough; and each fluid applicator has an outer face extending from the perimeter of the applicator opening, the surface of the applicator outer face comprising a non-wetting material.

36. The process of claim 35 where the non-wetting material is selected from the group consisting of TEFLON and a silicone compound.

37. The process of claim 35 where the non-wetting material is TEFLON.

38. The process of claim 22 where at least one of the one or more fluid applicators has walls therein defining a chamber, the chamber in communication with a source of fluid, and at least portions of the chamber walls are textured whereby the apparent viscosity of fluid flowing through the chamber is increased.

39. The process of claim 22 further comprising the step of applying a vacuum to within one or more of the fluid applicators to withdraw traces of fluid therein after fluid flow is terminated.

40. The process of claim 22 further comprising the step of removing volatile components of the fluid on the substrate surface within a time sufficient to prevent significant migration of the fluid along the substrate surface.

41. The process of claim 22 where the substrate is a printed circuit board substrate.

42. The process of claim 22 where the substrate is an integrated circuit substrate.

* * * * *